(12) United States Patent
Wang et al.

(10) Patent No.: US 10,999,544 B2
(45) Date of Patent: May 4, 2021

(54) IMAGE SENSOR INCLUDING PHASE DETECTION PIXELS AND IMAGE PICKUP DEVICE

(71) Applicant: Samsung Electronics Co., Ltd., Suwon-si (KR)

(72) Inventors: Tae-shick Wang, Seoul (KR); Chae-sung Kim, Seoul (KR); Sung-jin Park, Suwon-si (KR); Joon-hyuk Im, Seoul (KR)

(73) Assignee: Samsung Electronics Co., Ltd.

( * ) Notice: Subject to any disclaimer, the term of this patent is extended or adjusted under 35 U.S.C. 154(b) by 13 days.

(21) Appl. No.: 16/292,929

(22) Filed: Mar. 5, 2019

(65) Prior Publication Data
US 2019/0281226 A1 Sep. 12, 2019

(30) Foreign Application Priority Data
Mar. 9, 2018 (KR) .................. 10-2018-0028307

(51) Int. Cl.
*H04N 5/369* (2011.01)
*H04N 5/232* (2006.01)
*H04N 9/04* (2006.01)
*H01L 27/146* (2006.01)
*H04N 5/3745* (2011.01)

(52) U.S. Cl.
CPC ... *H04N 5/36961* (2018.08); *H01L 27/14605* (2013.01); *H01L 27/14621* (2013.01); *H01L 27/14623* (2013.01); *H01L 27/14627* (2013.01); *H01L 27/14641* (2013.01); *H04N 5/232122* (2018.08); *H04N 5/37457* (2013.01); *H04N 9/0455* (2018.08); *H04N 9/04555* (2018.08); *H01L 27/14645* (2013.01)

(58) Field of Classification Search
CPC ......... H04N 5/23212; H04N 5/232122; H04N 5/2355; H04N 5/355; H04N 5/35563; H04N 5/3696; H04N 5/36961; H04N 5/37457; H01L 27/14603–14607; H01L 27/14641; H01L 27/14627
See application file for complete search history.

(56) References Cited

U.S. PATENT DOCUMENTS

| 9,338,380 | B2 | 5/2016 | Mlinar |
| 9,432,568 | B2 | 8/2016 | Mlinar et al. |
| 9,445,018 | B2 | 9/2016 | Fettig et al. |
| 9,455,285 | B2 | 9/2016 | Keelan et al. |
| 9,485,442 | B1 | 11/2016 | Li et al. |
| 9,729,806 | B2 | 8/2017 | Fettig et al. |

(Continued)

*Primary Examiner* — Paul M Berardesca
(74) *Attorney, Agent, or Firm* — Myers Bigel, P.A.

(57) ABSTRACT

An image sensor includes a pixel array that includes a first pixel group and a second pixel group, each including a plurality of image pixels to generate image data. The first pixel group includes a first phase detection pixel pair including first phase detection pixels arranged adjacent to each other in a first direction and having at least one first microlens thereon, and the second pixel group includes a second phase detection pixel pair including second phase detection pixels arranged adjacent to each other in a second direction different from the first direction and having at least one second microlens thereon. The sensitivity of the first phase detection pixels is different from the sensitivity of the second phase detection pixels.

11 Claims, 17 Drawing Sheets

(56) References Cited

U.S. PATENT DOCUMENTS

| | | | |
|---|---|---|---|
| 9,787,889 B2 | 10/2017 | Johnson | |
| 2013/0208141 A1* | 8/2013 | Kwan | G06T 5/50 |
| | | | 348/229.1 |
| 2015/0062422 A1 | 3/2015 | Stern | |
| 2015/0076643 A1* | 3/2015 | Kikuchi | H01L 27/14685 |
| | | | 257/432 |
| 2015/0234148 A1* | 8/2015 | Kusaka | G03B 13/36 |
| | | | 348/349 |
| 2016/0269662 A1 | 9/2016 | Hepper et al. | |
| 2016/0365373 A1 | 12/2016 | Keelan et al. | |
| 2017/0339384 A1* | 11/2017 | Okazawa | H04N 9/646 |
| 2017/0366769 A1* | 12/2017 | Mlinar | H04N 5/35563 |
| 2018/0352199 A1* | 12/2018 | Hwang | H01L 27/14605 |
| 2019/0082130 A1* | 3/2019 | Li | G02B 7/36 |
| 2019/0132506 A1* | 5/2019 | Cheng | H04N 5/36961 |
| 2020/0059604 A1* | 2/2020 | Zeng | H04N 5/23212 |
| 2020/0186723 A1* | 6/2020 | Kang | H04N 5/23212 |

\* cited by examiner

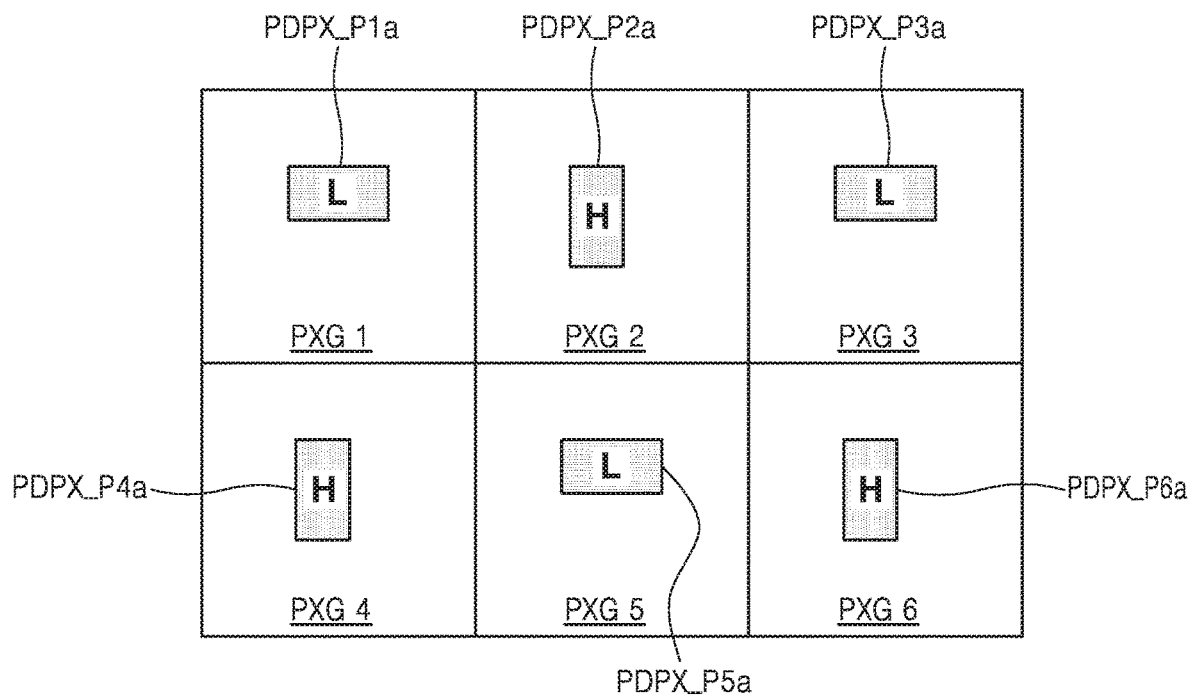
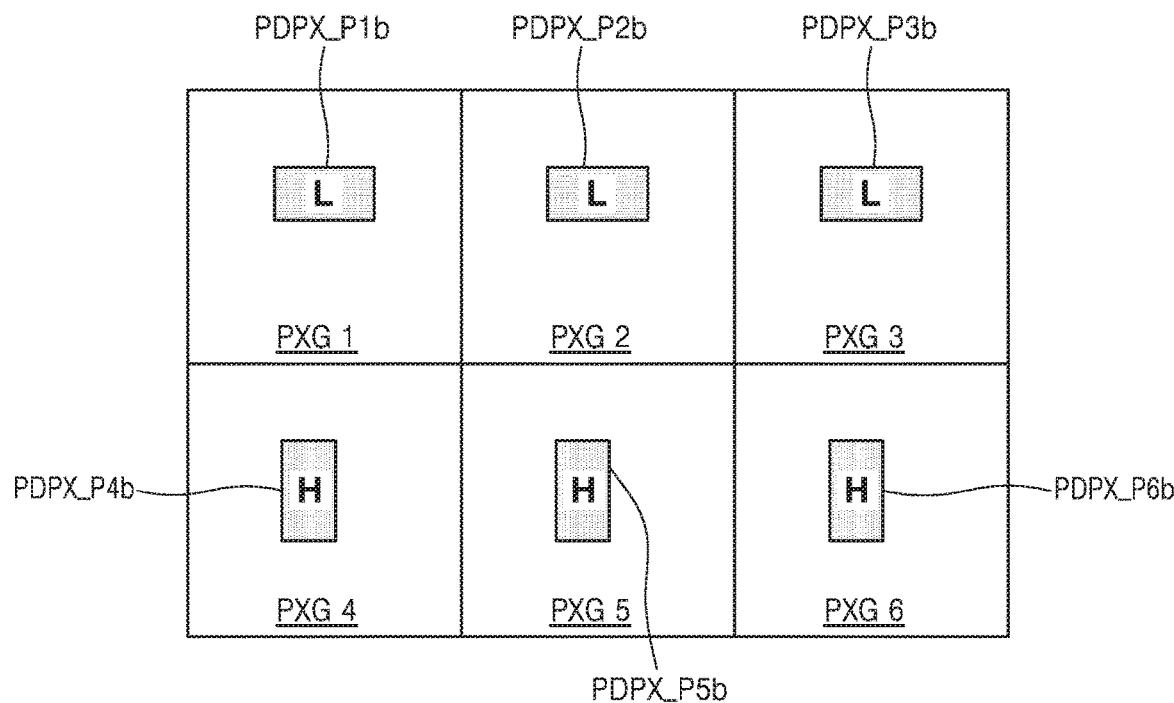

IMAGE SENSOR INCLUDING PHASE DETECTION PIXELS AND IMAGE PICKUP DEVICE

CROSS-REFERENCE TO RELATED APPLICATION

This application claims the benefit of Korean Patent Application No. 10-2018-0028307, filed on Mar. 9, 2018, in the Korean Intellectual Property Office, the disclosure of which is incorporated by reference herein in its entirety.

BACKGROUND

The inventive concepts relate to image sensors, and more particularly, to image sensors including phase detection pixels and image pickup devices.

There may be an increasing number of image sensors including phase detection pixels for detecting a phase difference between images or image pickup devices including such image sensors. Some conventional phase detection pixels may be implemented with a single sensitivity because they either include a particular color filter (for example, one of red, green, and blue color filters) or do not include a color filter. Thus, phase detection pixels having a single sensitivity may fail in detecting accurate phase differences depending on imaging conditions (for example, illumination condition and scene contents).

SUMMARY

The inventive concepts provide image sensors including phase detection pixels capable of detecting accurate phase differences under various imaging conditions, and image pickup devices.

According to an aspect of the inventive concepts, there is provided an image sensor including a pixel array, where the pixel array includes a first pixel group and a second pixel group, each including a plurality of image pixels to generate image data. The first pixel group includes a first phase detection pixel pair including first phase detection pixels arranged adjacent to each other in a first direction and covered with one first single microlens, and the second pixel group includes a second phase detection pixel pair including second phase detection pixels arranged adjacent to each other in a second direction different from the first direction and covered with one second single microlens. The sensitivity of the first phase detection pixels is different from the sensitivity of the second phase detection pixels.

According to another aspect of the inventive concepts, there is provided an image sensor including a pixel array, where the pixel array includes a first pixel group and a second pixel group, each including a plurality of image pixels to generate image data. The first pixel group includes a first phase detection pixel pair including first phase detection pixels arranged adjacent to each other in a first direction and each individually covered with a respective microlens, and the second pixel group includes a second phase detection pixel pair including second phase detection pixels arranged adjacent to each other in a second direction different from the first direction and each individually covered with a respective microlens. The sensitivity of the first phase detection pixels is different from the sensitivity of the second phase detection pixels.

According to a further aspect of the inventive concepts, an image sensor includes a pixel array including a plurality of shared pixels, where the plurality of shared pixels include a first shared phase detection pixel including first phase detection subpixels arranged adjacent to each other in a first direction, and a second shared phase detection pixel including second phase detection subpixels arranged adjacent to each other in a second direction different from the first direction. A first sensitivity of the first phase detection subpixels is different from a second sensitivity of the second phase detection subpixels.

An image pickup device includes a lens, a lens driver configured to control a position of the lens, a pixel array, and a processor. The pixel array includes a first phase detection pixel pair including first phase detection pixels arranged adjacent to each other in a first direction and having a first sensitivity, and a second phase detection pixel pair including second phase detection pixels arranged adjacent to each other in a second direction different from the first direction and having a second sensitivity different from the first sensitivity. The processor is configured to perform a computation of a sensitivity-based phase difference by using first phase information received from the first phase detection pixel pair and/or second phase information received from the second phase detection pixel pair, and to control the lens driver based on a result of the computation.

BRIEF DESCRIPTION OF THE DRAWINGS

Embodiments of the inventive concepts will be more clearly understood from the following detailed description taken in conjunction with the accompanying drawings in which:

FIGS. 7A through 7C are diagrams illustrating arrangement patterns of phase detection pixel pairs according to some embodiments;

DETAILED DESCRIPTION OF THE EMBODIMENTS

Hereinafter, embodiments of the inventive concepts will be described in detail with reference to the accompanying drawings.

Figure 1:
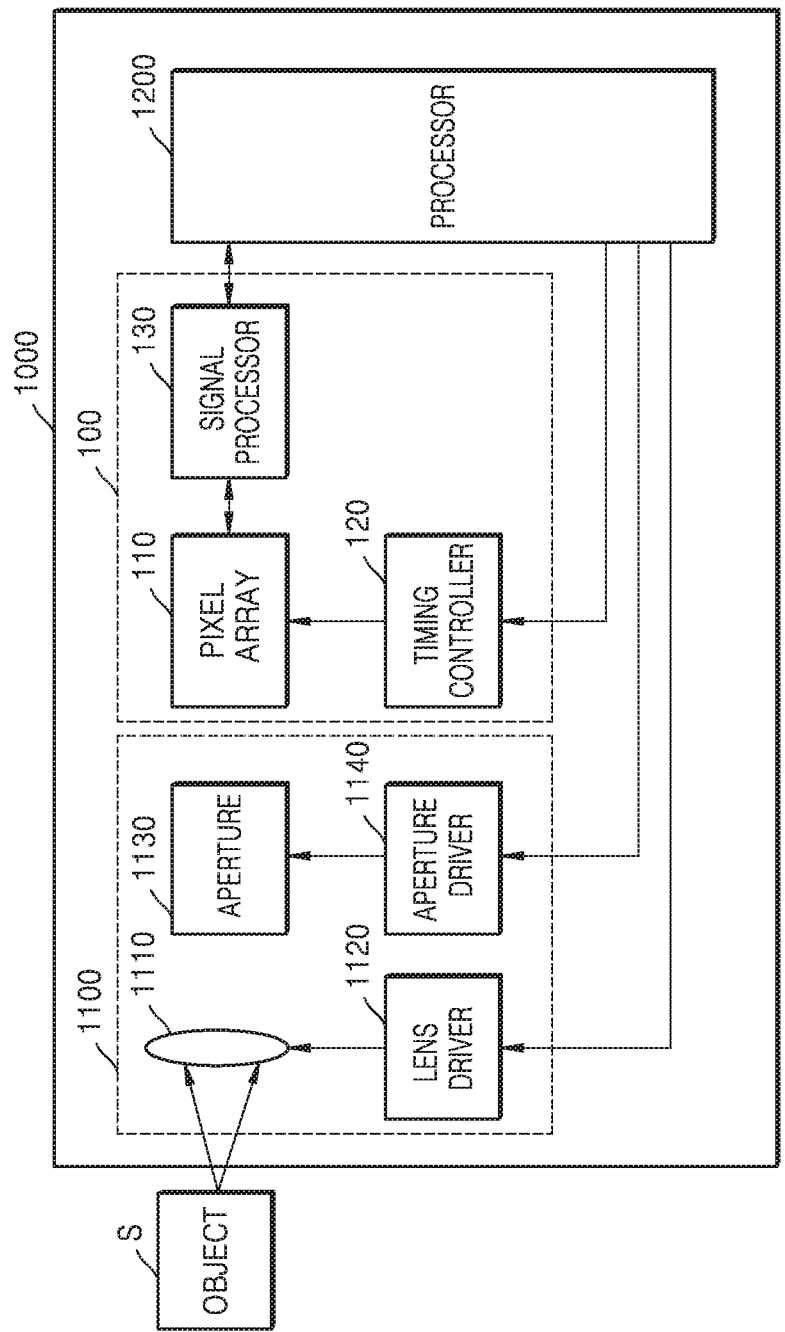
FIG. 1 is a diagram illustrating an example structure of an image pickup device according to some embodiments, to explain an operation of an auto focus function of the image pickup device.

FIG. 1 is a diagram illustrating an example structure of an image pickup device 1000 according to some embodiments to explain an operation of an auto focus (AF) of the image pickup device 1000.

Referring to FIG. 1, the image pickup device 1000 may include an imaging unit 1100, an image sensor 100, and a processor 1200. The image pickup device 1000 may support a focus detection function.

An overall operation of the image pickup device 1000 may be controlled by the processor 1200. The processor 1200 may provide control signals for operation of one or more components of the image pickup device 1000 to a lens driver 1120, an aperture driver 1140, a timing controller 120, and the like.

The imaging unit 1100 may include, as components to receive light, a lens 1110, the lens driver 1120, an aperture 1130, and the aperture driver 1140. The lens 1110 may include a plurality of lenses.

The lens driver 1120 may exchange (e.g., transmit and receive) information about focus detection with the processor 1200 and adjust a position of the lens 1110 according to the control signal provided by the processor 1200. The lens driver 1120 may move the lens 1110 in a direction in which a distance from an object S to the lens 1110 either increases or decreases. Therefore, the distance between the lens 1110 and the object S may be adjusted. The object S may be focused or blurred depending on the position of the lens 1110.

For example, when the distance between the lens 1110 and the object S is relatively close, the lens 1110 may be out of an in-focus position for focusing on the object S, and a phase difference may occur between images captured by the image sensor 100. The lens driver 1120 may move the lens 1110 in a direction in which the distance from the object S is increased based on the control signal provided by the processor 1200.

Alternatively, when the distance between the lens 1110 and the object S is relatively long or far, the lens 1110 may be out of the in-focus position, and a phase difference may occur between the images formed on the image sensor 100. The lens driver 1120 may move the lens 1110 in a direction in which the distance from the object S is decreased based on the control signal provided by the processor 1200.

The image sensor 100 may convert incident light into an image signal. The image sensor 100 may include a pixel array 110, the timing controller 120, and a signal processor 130. An optical signal transmitted through the lens 1110 and the aperture 1130 may reach a light receiving surface of the pixel array 110, and may form an image of the subject S.

The pixel array 110 may include a complementary metal oxide semiconductor image sensor (CIS) that converts the optical signal into an electrical signal. The pixel array 110 may be adjusted in sensitivity or the like by the timing controller 120. The pixel array 110 may include a plurality of phase detection pixels. The phase detection pixels according to some embodiments may be arranged adjacent to each other in at least two directions and the phase detection pixels arranged adjacent to each other may constitute or define a phase detection pixel pair. In addition, the pixel array 110 may include phase detection pixels having different sensitivity from each other. Specific embodiments of the phase detection pixels are described below with reference to FIG. 2 and the like.

The processor 1200 may perform a phase difference calculation by receiving phase information (or pixel information) from the signal processor 130, and the phase difference calculation may be performed by executing a correlation calculation of signals of a plurality of pixels. The processor 1200 according to some embodiments may perform the phase difference calculation based on the sensitivity by using phase detection pixels having different sensitivity from each other. For example, the processor 1200 may first perform the phase difference calculation by using high sensitivity phase detection pixels, and perform the phase difference calculation by using low sensitivity phase detection pixels based on a confidence level of the generated phase difference value. A specific embodiment of this matter is described later with reference to FIGS. 11 and 12.

The processor 1200 may obtain, as a result of the phase difference calculation, a position of a focus, a direction of the focus, and/or the distance between the object S and the image sensor 100. The processor 1200 may output the control signal to the lens driver 1120 to move the position of the lens 1110 based on the result of the phase difference calculation.

The processor 1200 may perform image signal processing to reduce noise in an input signal and for color improvement such as (but not limited to) a gamma correction, a color filter array interpolation, a color matrix, a color correction, and/or a color enhancement. In addition, the processor 1200 may generate an image file by compressing image data generated by the image signal processing for picture improvement, or may recover the image data from the image file.

Figure 2:
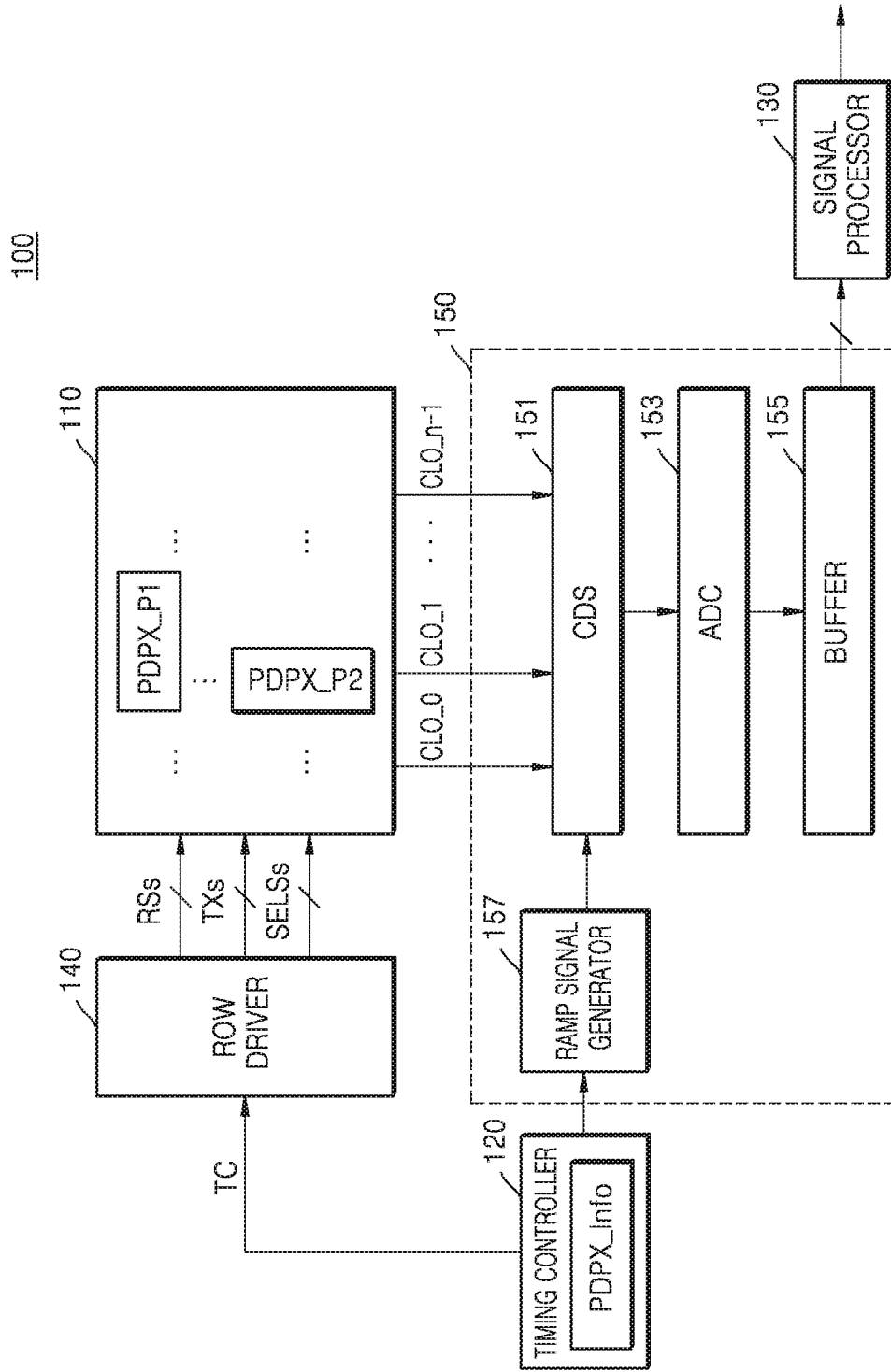
FIG. 2 is a block diagram illustrating a configuration of an image sensor according to some embodiments.

FIG. 2 is a block diagram illustrating a configuration of the image sensor 100 according to some embodiments.

Referring to FIGS. 1 and 2, the image sensor 100 may include the pixel array 110, the timing controller 120, the signal processor 130, a row driver 140, and a signal reader 150.

The pixel array 110 may be formed in pixel units, and may include a plurality of image pixels and a plurality of phase detection pixels. Each of the image pixels and the phase detection pixels may include a photo-sensing element. For example, the photo-sensing element may include a photodiode. The image pixels and the phase detection pixels may absorb light to generate charge, and an electrical signal according to the generated charge may be provided to the signal reader 150 as $0^{th}$ through $(n-1)^{th}$ output voltages CLO_0 through CLO_$n$−1.

The image sensing pixels may generate image signals corresponding to the object S in FIG. 1. The phase detection pixels may generate phase signals that are used to calculate the phase difference between images generated by imaging the object S.

In some embodiments, the pixel array 110 may include a first phase detection pixel pair PDPX_P1 and a second phase detection pixel pair PDPX_P2. While the terms first, second, etc. may be used herein to describe various elements, these elements should not be limited by these terms; rather, these terms are used only to distinguish one element from another element. The first phase detection pixel pair PDPX_P1 may include two or more phase detection pixels arranged adjacent to each other in a horizontal direction, and the second phase detection pixel pair PDPX_P2 may include two or more phase detection pixels arranged adjacent to each other in a vertical direction. The first phase detection pixel pair PDPX_P1 may include phase detection pixels for detecting the phase difference between images based on a horizontal direction or a vertical direction, and the second phase detection pixel pair PDPX_P2 may include phase detection pixels for detecting the phase difference between the images of the object S in the vertical or horizontal direction. For example, when the first phase detection pixel pair PDPX_P1 is for detecting the phase difference between the images based on the horizontal direction, the second phase detection pixel pair PDPX_P2 may be complementary to the first phase detection pixel pair PDPX_P1 and may be for detecting the phase difference between the images based on the vertical direction.

In addition, the sensitivity of the phase detection pixels included in the first phase detection pixel pair PDPX_P1 and the phase detection pixels included in the second phase detection pixel pair PDPX_P2 may be different from each other. Although only the first phase detection pixel pair PDPX_P1 and the second phase detection pixel pair PDPX_P2 are illustrated in FIG. 2, embodiments described herein are not limited thereto, and the pixel array 110 may further include a plurality of phase detection pixel pairs having the same sensitivity characteristics or the same arrangement characteristics as any one of the first phase detection pixel pair PDPX_P1 and the second phase detection pixel pair PDPX_P2. The pixel array 110 may further include phase detection pixel pairs having the same sensitivity characteristics and the same arrangement characteristics as the first phase detection pixel pair PDPX_P1, and phase detection pixel pairs having the same sensitivity characteristics and the same arrangement characteristics as the second phase detection pixel pair PDPX_P2. Furthermore, the pixel array 110 may include phase detection pixel pairs having the same sensitivity characteristics as the first phase detection pixel pair PDPX_P1 and the same arrangement characteristics as the second phase detection pixel pair PDPX_P2, and phase detection pixel pairs having the same sensitivity characteristics as the second phase detection pixel pair PDPX_P2 and the same arrangement characteristics as the first phase detection pixel pair PDPX_P1. That is, the pixel array 110 may include phase detection pixel pairs having any combination of the sensitivity and arrangement characteristics of PDPX_P1 and PDPX_P2.

Moreover, the description above is only an example and is not limited thereto, and the pixel array 110 may be, unlike illustrated in FIG. 2, variously implemented to include a plurality of phase detection pixel pairs each having at least three types of arrangement characteristics and at least three types of sensitivity characteristics.

Hereinafter, it is assumed that the first phase detection pixel pair PDPX_P1 may have less sensitivity than the second phase detection pixel pair PDPX_P2 and may be used to detect the phase difference between the images based on the horizontal direction, and the second phase detection pixel pair PDPX_P2 may be used to detect the phase difference between the images based on the vertical direction, but this is only for convenience of explanation and embodiments described herein are not limited thereto.

The phase detection pixels including the first phase detection pixel pair PDPX_P1 and the second phase detection pixel pair PDPX_P2 included in the image sensor 100 may be used to focus on the object S. In some embodiments, the processor 1200 in FIG. 1 may first perform a phase difference calculation operation between images by using high sensitivity phase detection pixels. In other words, the processor 1200 may perform the phase difference calculation operation between the images by using the phase detection pixel pairs having the same sensitivity characteristics and arrangement characteristics as the second phase detection pixel pair PDPX_P2, and may generate a high sensitivity phase difference value and the confidence level of the high sensitivity phase difference value. The confidence level of the high sensitivity phase difference value may be an index indicating an accuracy of the high sensitivity phase difference value, and may be generated based on parameters such as (but not limited to) an illumination condition, texture of the object S, and/or an imaging area of the object S at the time of imaging of the object S. For example, when illuminance of the object S is greater than a certain amount at the time of imaging, the photodiodes of the high sensitivity phase detection pixels may be saturated and thus, may not generate adequate phase signals, and the processor 1200 may, considering such illuminance condition, generate the confidence level indicating that the accuracy of the high sensitivity phase difference value generated under a current imaging condition is low. As another example, even when an area of the object S to be imaged does not include a top edge area or a bottom edge area of the object S, the processor 1200 may generate the confidence level indicating that the accuracy of the high sensitivity phase difference value generated in the current imaging condition is low. For example, the accuracy of the high sensitivity phase difference value may be low when the confidence level is low.

In some embodiments, the processor 1200 may perform the AF operation by using the high sensitivity phase difference value when the confidence level of the high sensitivity phase difference value is equal to or greater than a certain threshold value. A threshold value may be set to various values depending on the imaging conditions and the like. The processor 1200 may perform the phase difference calculation operation between the images by using the low sensitivity phase detection pixels when the confidence level of the high sensitivity phase difference value is less than the certain threshold value. In other words, the processor 1200 may perform the phase difference calculation operation between the images by using the phase detection pixel pairs having the same sensitivity characteristics and arrangement characteristics as the first phase detection pixel pair PDPX_P1, and may generate low sensitivity phase difference value and the confidence level of the low sensitivity phase difference value.

In some embodiments, the processor 1200 may perform the AF operation by using the low sensitivity phase difference value when the confidence level of the low sensitivity phase difference value is equal to or greater than a certain threshold value. The processor 1200 may perform a contrast AF operation when the confidence level of the low sensitivity phase difference value is less than a certain threshold value.

The phase signals may include information about positions of images formed in the image sensor 100. Thus, the phase signals may be used to calculate the phase differences between the images. The in-focus position of the lens 1110 (in FIG. 1) may be calculated based on the calculated phase differences. For example, the position of the lens 1110 (in FIG. 1) that makes the phase difference zero may be the in-focus position.

In some embodiments of the present inventive concepts, the plurality of phase detection pixels may be used not only to focus on the object S but also to measure the distance between the object S and the image sensor 100. For a measurement of the distance between the object S and the image sensor 100, additional information such as (but not limited to) the phase differences between the images formed on the image sensor 100, the distance between the lens 1110 and the image sensor 100, a size of the lens 1110, and/or the in-focus position of the lens 1110 may be referred to.

The timing controller 120 may control the row driver 140 by providing a timing control signal TC to the row driver 140 so that the pixel array 110 accumulates charge by absorbing light, temporarily stores the accumulated charge, and outputs an electrical signal according to the stored charge to the outside of or external to the pixel array 110. In some embodiments, the timing controller 120 may adjust the sensitivity of the phase detection pixels by controlling a light exposure time for the phase detection pixels with reference to phase detection pixel information. For example, the timing controller 120 may make the sensitivity of the first phase detection pixel pair PDPX_P1 different from the sensitivity of the second phase detection pixel pair PDPX_P2 by controlling the light exposure time of the first phase detection pixel pair PDPX_P1 to be shorter than the light exposure time of the second phase detection pixel pair PDPX_P2. The PDPX_Info may include position information about the first and second phase detection pixel pairs PDPX_P1 and PDPX_P2. In addition, the timing controller 120 may control the signal reader 150 to measure an output voltage provided by the pixel array 110.

The row driver 140 may generate reset control signals RSs, transmission control signals TXs, and selection signals SELSs to control the pixel array 110, and provide them to the plurality of phase detection pixels included in the pixel array 110. The row driver 140 may determine an activation timing and an inactivation timing of the reset control signals RSs, the transmission control signals TXs, and the selection signals SELSs for the plurality of phase detection pixels based on whether the AF function is to be performed.

The signal reader 150 may include a correlated double sampler (CDS) 151, an analog-to-digital converter (ADC) 153, and a buffer 155. The CDS 151 may sample and hold the $0^{th}$ through $(n-1)^{th}$ output voltage CLO_0 through CLO_$n$-1 provided by the pixel array 110. The CDS 151 may double-sample a certain noise level and a level of the $0^{th}$ through $(n-1)^{th}$ output voltage CLO_0 through CLO_$n$-1, and output a level corresponding to a difference therebetween. In addition, the CDS 151 may receive ramp signals generated by a ramp signal generator 157, compare them with each other, and output a result of the comparison. The ADC 153 may convert an analog signal corresponding to the level received from the CDS 151 into a digital signal. The buffer 155 may latch the digital signal and the latched digital signal may be sequentially output to the outside of or external to the signal processor 130 or the image sensor 100.

The signal processor 130 may perform the signal processing on data received from the plurality of pixels. The signal processor 130 may perform a noise reduction processing, a gain adjustment, a waveform shaping processing, an interpolation processing, a white balance processing, a gamma processing, an edge emphasis processing, and the like. In addition, the signal processor 130 may output the phase information of the phase detection pixels to the processor 1200 during the phase difference AF to perform the phase difference calculation. In some embodiments, the signal processor 130 may be included in the processor 1200 (in FIG. 1) outside the image sensor 100.

Through a configuration of the pixel array 110 provided with the phase detection pixels having various sensitivity characteristics and various arrangement characteristics according to some embodiments of the present inventive concepts, the AF function may be improved by accurately calculating the phase difference between the images.

Figure 3:
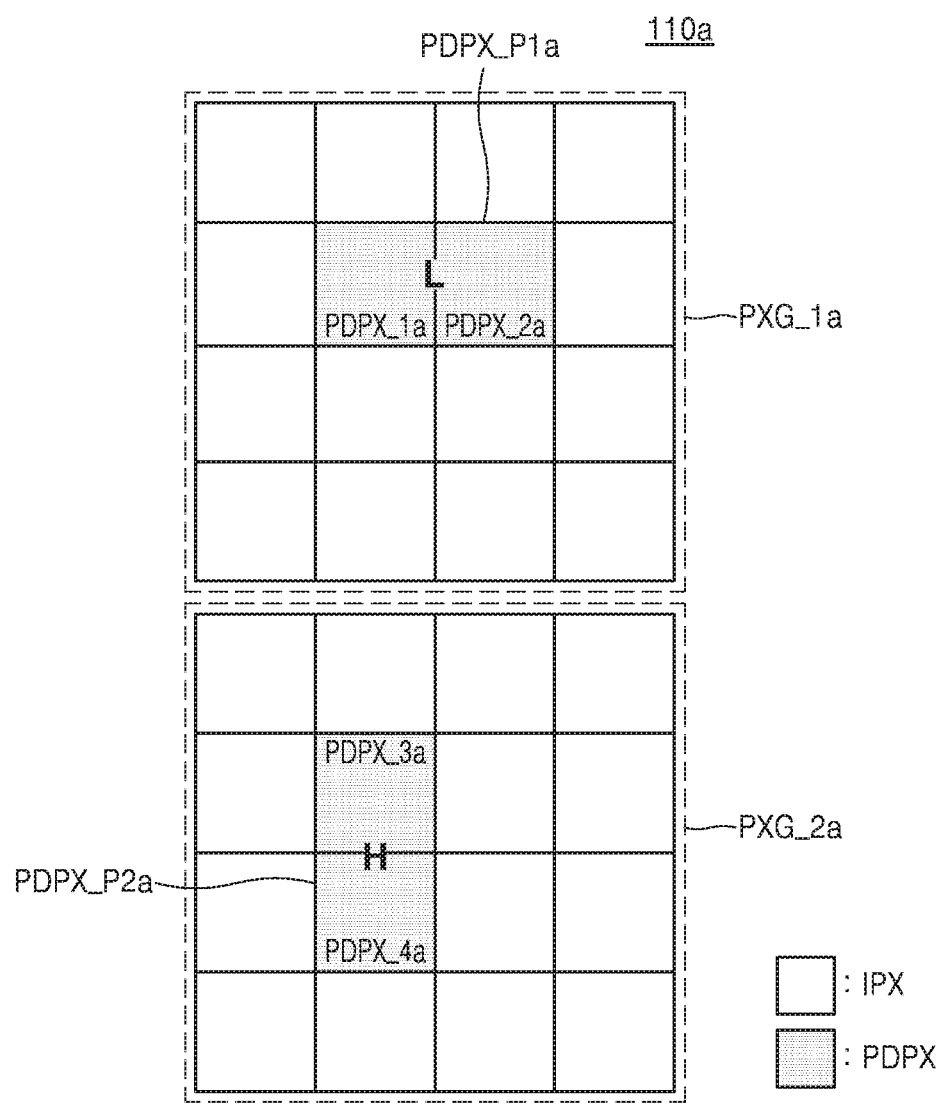
FIG. 3 is a diagram illustrating a partial configuration of a pixel array according to some embodiments.

FIG. 3 is a diagram illustrating a partial configuration of a pixel array 110*a* according to some embodiments.

Referring to FIG. 3, the pixel array 110*a* may include a first pixel group PXG_1*a* and a second pixel group PXG_2*a*. Hereinafter, it is described for convenience that a pixel group is a unit including a plurality of image pixels IPXs and one phase detection pixel pair; however, additional phase detection pixel pairs may be present.

The second pixel group PXG_2*a* may be arranged adjacent to the first pixel group PXG_1*a* in a downward direction. The first pixel group PXG_1*a* may include the plurality of image pixels IPXs and a first phase detection pixel pair PDPX_P1*a*, and the second pixel group PXG_2*a* may include the plurality of image pixels IPXs and a second phase detection pixel pair PDPX_P2*a*. The first phase detection pixel pair PDPX_P1*a* may include first phase detection pixels PDPX_1*a* and PDPX_2*a*, and the second phase detection pixel pair PDPX_P2*a* may include second phase detection pixels PDPX_3*a* and PDPX_4*a*. In some embodiments, the first phase detection pixels PDPX_1*a* and PDPX_2*a* in the first phase detection pixel pair PDPX_P1*a* may be arranged adjacent to each other in the horizontal direction, and the second phase detection pixels PDPX_3*a* and PDPX_4*a* in the second phase detection pixel pair PDPX_P2*a* may be arranged adjacent to each other in the vertical direction. In addition, the sensitivity of the first phase detection pixel pair PDPX_P1*a* may be less than the sensitivity of the second phase detection pixel pair PDPX_P2*a*. However, embodiments described herein are not limited thereto, and the sensitivity of the first phase detection pixel pair PDPX_P1*a* may be greater than the sensitivity of the second phase detection pixel pair PDPX_P2*a*.

A configuration of the first pixel group PXG_1*a* and the second pixel group PXG_2*a* illustrated in FIG. 3 is not limited thereto, and the first pixel group PXG_1*a* and the second pixel group PXG_2*a* may include more or less image pixels IPXs and arrangements of the first phase detection pixel pair PDPX_P1*a* and the second phase detection pixel pair PDPX_P2*a* may be variously implemented.

Figure 4A:
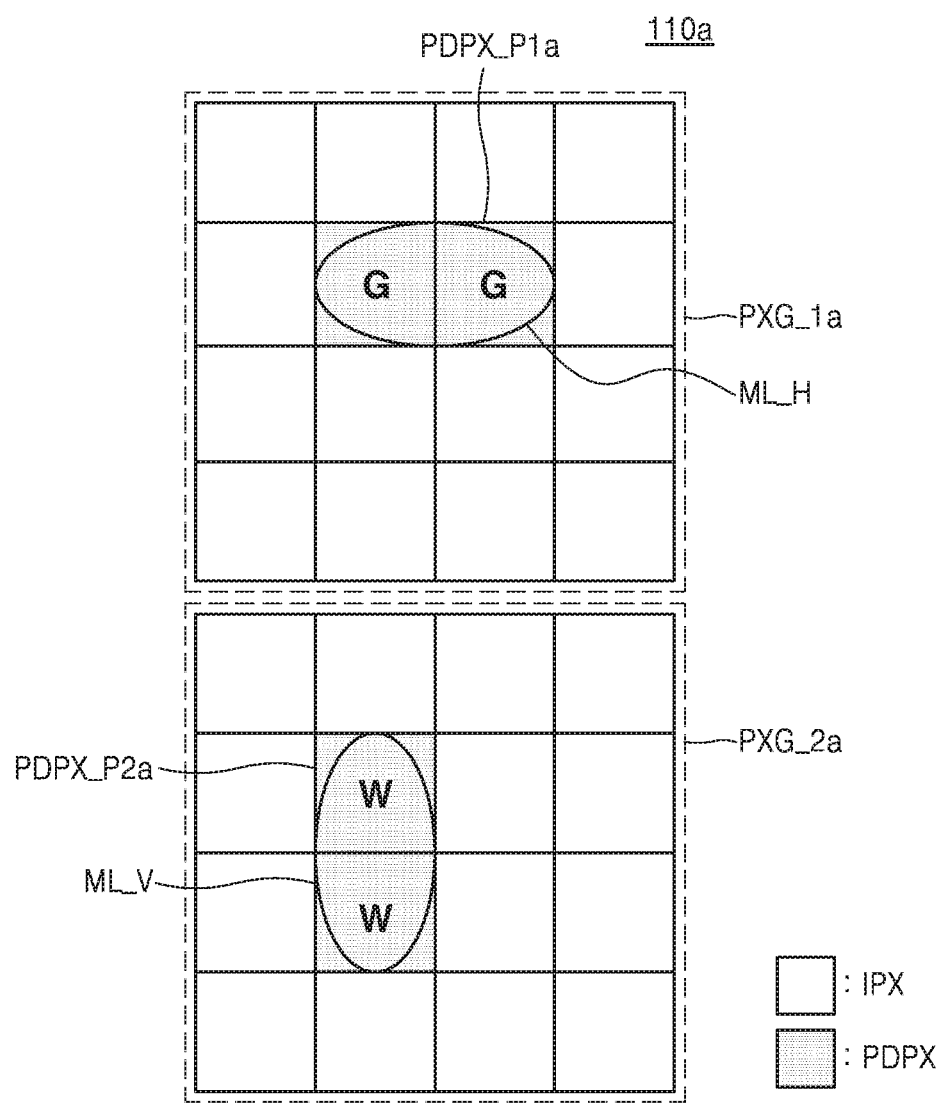
FIG. 4A is a diagram illustrating a specific configuration of a first phase detection pixel pair and a second phase detection pixel pair according to some embodiments.
Figure 4B:
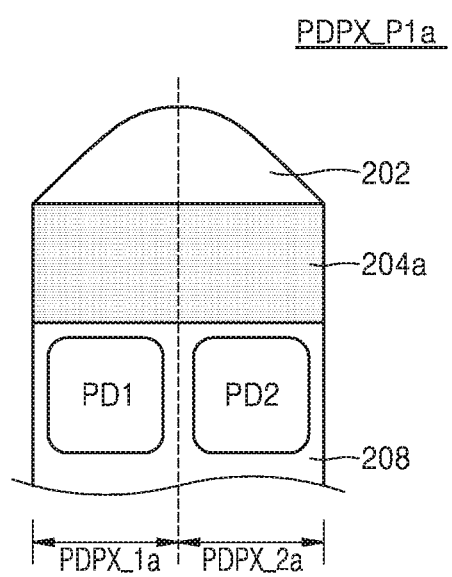
FIG. 4B is a diagram illustrating a specific configuration of the first phase detection pixel pair according to some embodiments.

FIG. 4A is a diagram illustrating a specific configuration of the first phase detection pixel pair PDPX_P1*a* and the second phase detection pixel pair PDPX_P2*a* according to some embodiments, and FIG. 4B is a diagram illustrating a specific configuration of the first phase detection pixel pair PDPX_P1*a*.

Referring to FIG. 4A, a type of the color filter included in the first phase detection pixels of the first phase detection pixel pair PDPX_P1*a* and a type of the color filter included in the second phase detection pixels of the second phase detection pixel pair PDPX_P2*a* may be different from each other, so that the sensitivity of the first phase detection pixel pair PDPX_P1*a* is different from the sensitivity of the second phase detection pixel pair PDPX_P2*a*. In one example, the first phase detection pixels of the first phase detection pixel pair PDPX_P1*a* may each include a green color filter, and the second phase detection pixels of the second phase detection pixel pair PDPX_P2*a* may each include a white color filter (or may not include any color filter). In addition, the first phase detection pixel pair PDPX_P1*a* may be covered with one horizontal microlens ML_H, and the second phase detection pixel pair PDPX_P2*a* may be covered with one vertical microlens ML_V. In another embodiment, the type of the color filter included in first phase detection pixels of the first phase detection pixel pair PDPX_P1a is same as the type of the color filter included in the second phase detection pixels of the second phase detection pixel pair PDPX_P2a. For example, the first phase detection pixels of the first phase detection pixel pair PDPX_P1a may each include a white color filter, and the second phase detection pixels of the second phase detection pixel pair PDPX_P2a may each include a white color filter. That is, a single microlens ML_H may be provided on both pixels of the first phase detection pixel pair PDPX_P1a, and a single microlens ML_V may be provided on both pixels of the second phase detection pixel pair PDPX_P2a. When an element is referred to as being "on" or "connected to" another element, it can be directly on or connected to the other element, or intervening elements may be present. In contrast, when an element is referred to as being "directly on" or "directly connected to" another element, there are no intervening elements present.

Referring further to FIG. 4B, the first phase detection pixel pair PDPX_P1a may include the first phase detection pixels PDPX_1a and PDPX_2a. A first photodiode PD1 of the first phase detection pixel PDPX_1a and a second photodiode PD2 of the first phase detection pixel PDPX_2a may be arranged in a substrate 208. A color filter 204a (for example, a green color filter) may be arranged on the substrate 208. In addition, one microlens 202 may be arranged over the first phase detection pixel pair PDPX_P1a. A structure of or similar to the first phase detection pixel pair PDPX_P1a illustrated in FIG. 4B may also be applied to the second phase detection pixel pair PDPX_P2a. However, the type of the color filter included in the second phase detection pixel pair PDPX_P2a may be different from the type of the color filter included in the first phase detection pixel pair PDPX_P1a.

Figure 5:
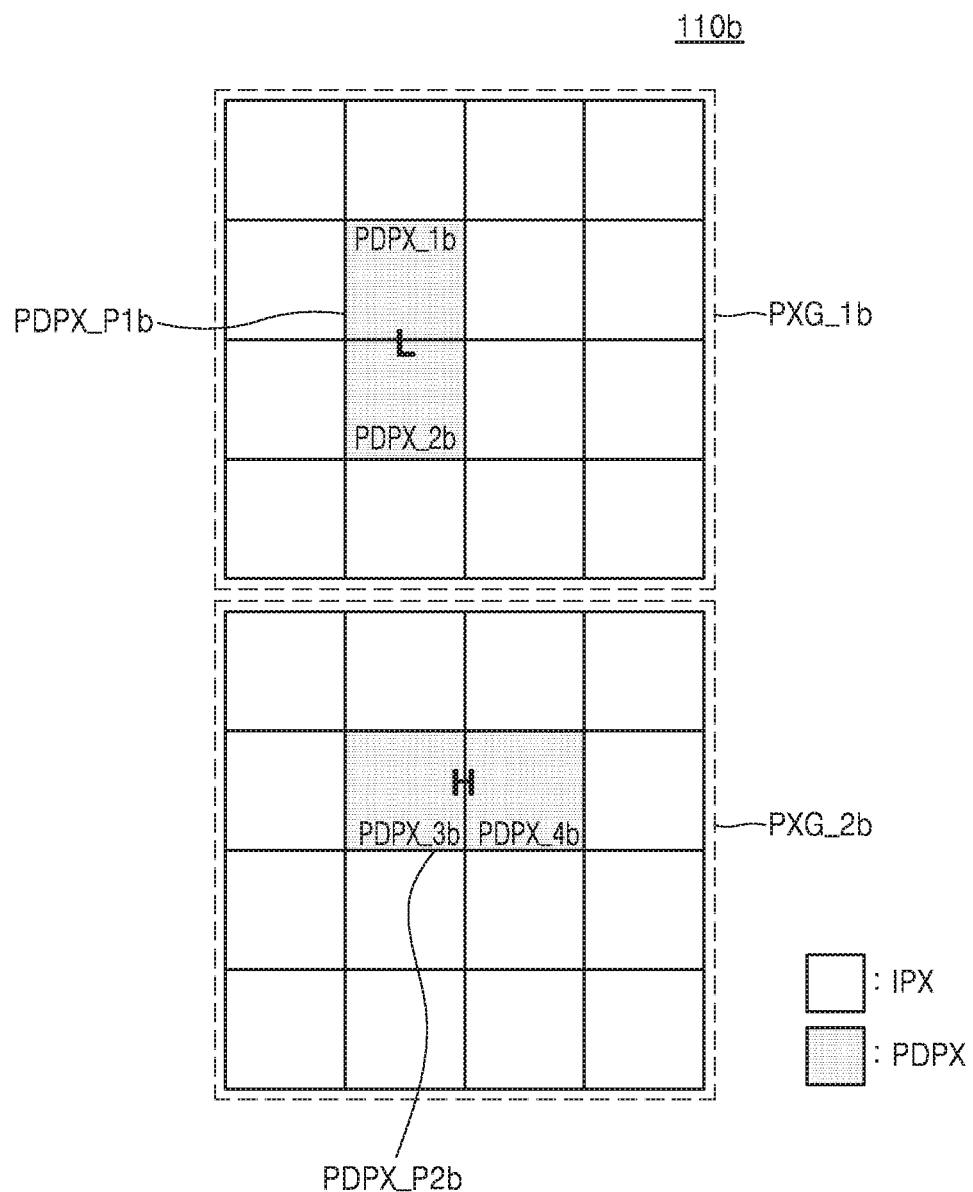
FIG. 5 is a diagram illustrating a partial configuration of a pixel array according to some embodiments.

FIG. 5 is a diagram illustrating a partial configuration of a pixel array 110b according to some embodiments.

Referring to FIG. 5, the pixel array 110b may include a first pixel group PXG_1b and a second pixel group PXG_2b. The second pixel group PXG_2b may be arranged adjacent to the first pixel group PXG_1b in the downward direction. The first pixel group PXG_1b may include the plurality of image pixels IPXs and a first phase detection pixel pair PDPX_P1b, and the second pixel group PXG_2b may include the plurality of image pixels IPXs and a second phase detection pixel pair PDPX_P2b. The first phase detection pixel pair PDPX_P1b may include first phase detection pixels PDPX_1b and PDPX_2b, and the second phase detection pixel pair PDPX_P2b may include second phase detection pixels PDPX_3b and PDPX_4b. In some embodiments, the first phase detection pixels PDPX_1b and PDPX_2b may be arranged adjacent to each other in the vertical direction in the first phase detection pixel pair PDPX_P1b, and the second phase detection pixels PDPX_3b and PDPX_4b may be arranged adjacent to each other in the horizontal direction in the second phase detection pixel pair PDPX_P2b. In addition, the sensitivity of the first phase detection pixel pair PDPX_P1b may be less than the sensitivity of the second phase detection pixel pair PDPX_P2b. However, embodiments described herein are not limited thereto, and the sensitivity of the first phase detection pixel pair PDPX_P1b may be greater than the sensitivity of the second phase detection pixel pair PDPX_P2b.

A configuration of the first pixel group PXG_1b and the second pixel group PXG_2b illustrated in FIG. 5 is not limited thereto, and the first pixel group PXG_1b and the second pixel group PXG_2b may include more or less image pixels IPXs, and arrangements of the first phase detection pixel pair PDPX_P1b and the second phase detection pixel pair PDPX_P2b may be variously implemented.

Figure 6A:
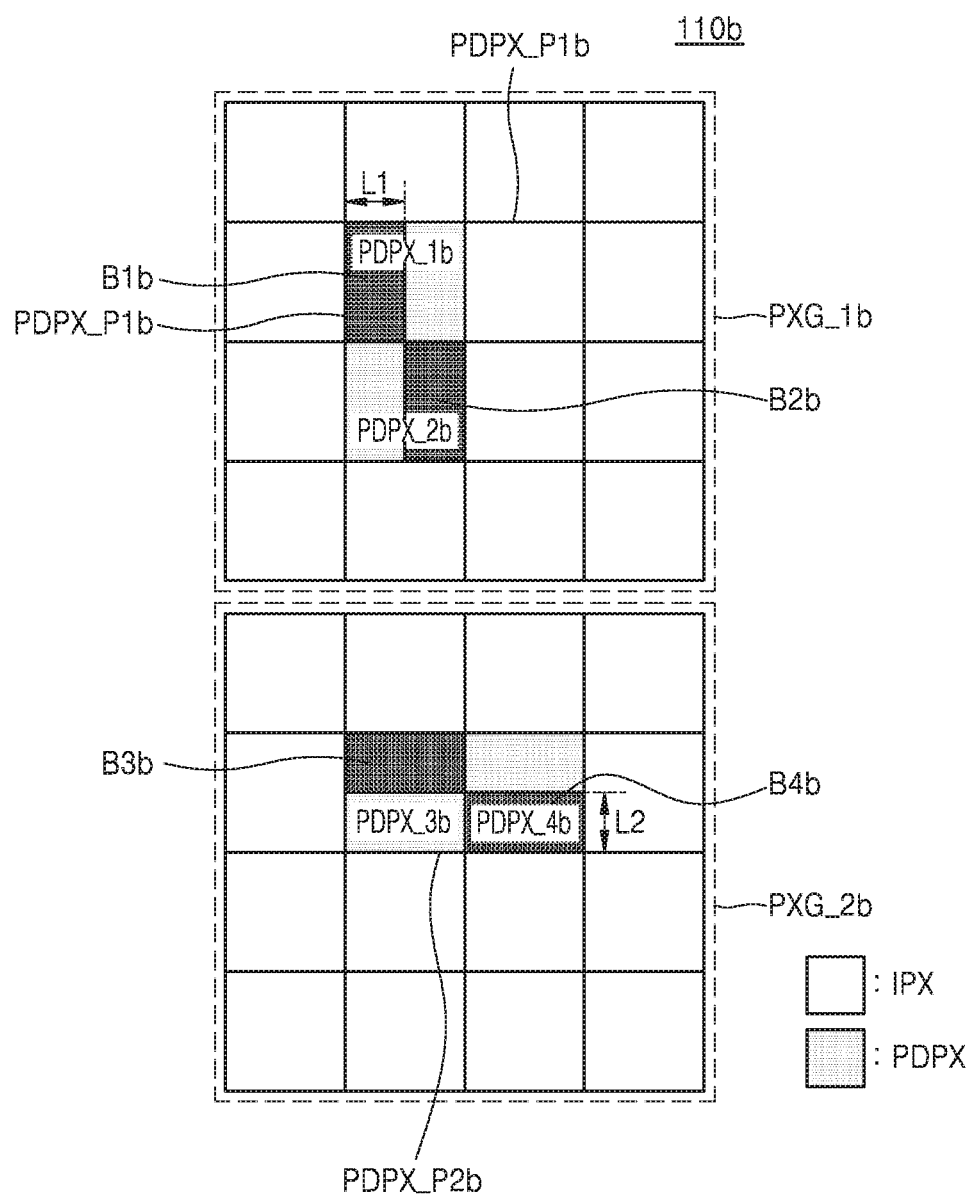
FIG. 6A is a diagram illustrating a specific configuration of a first phase detection pixel pair and a second phase detection pixel pair according to some embodiments.
Figure 6B:
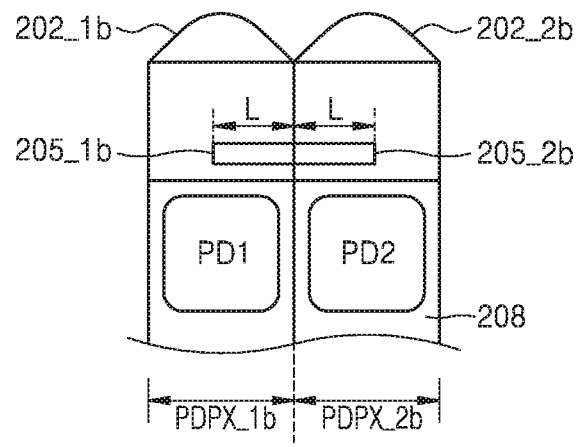
FIGS. 6B and 6C are diagrams illustrating specific configurations of the first phase detection pixel pair.
Figure 6C:
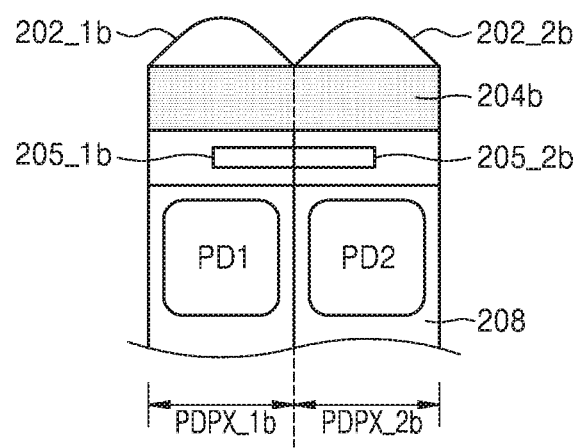

FIG. 6A is a diagram illustrating a specific configuration of the first phase detection pixel pair PDPX_P1b and the second phase detection pixel pair PDPX_P2b according to some embodiments, and FIGS. 6B and 6C are diagrams illustrating specific configurations of the first phase detection pixel pair PDPX_P1b.

Referring to FIG. 6A, a light blocking layer B1b may be formed on the left side of the first phase detection pixel PDPX_1b of the first phase detection pixel pair PDPX_P1b and a light blocking layer B2b may be formed on the right side of the second phase detection pixel PDPX_2b of the first phase detection pixel pair PDPX_P1b. In other words, the phase difference between the images of the object S in the horizontal direction may be detected by using the first phase detection pixel pair PDPX_P1b. A light blocking layer B3b may be formed on a top side of the second phase detection pixel PDPX_3b of the second phase detection pixel pair PDPX_P2b, and a light blocking layer B4b may be formed on a bottom side of the second phase detection pixel PDPX_4b of the second phase detection pixel pair PDPX_P2b. In other words, the phase difference between the images of the object S in the vertical direction may be detected by using the second phase detection pixel pair PDPX_P2b.

A length of the light blocking layers B1b and B2b included in the first phase detection pixels PDPX_1b and PDPX_2b of the first phase detection pixel pair PDPX_P1b and the length of the light blocking layers B3b and B4b included in the second phase detection pixels PDPX_3b and PDPX_4b of the second phase detection pixel pair PDPX_P2b may be different from each other, so that the sensitivity of the first phase detection pixel pair PDPX_P1b is different from the sensitivity of the second phase detection pixel pair PDPX_P2b. For example, the length L1 of the light blocking layers B1b and B2b of the first phase detecting pixel pair PDPX_P1b may be greater than the length L2 of the light blocking layers B3b and B4b of the second phase detecting pixel pair PDPX_P2b. In addition, each of the first phase detecting pixels PDPX_1b and PDPX_2b may be individually covered with a respective microlens, and each of the second phase detecting pixels PDPX_3b and PDPX_4b may be individually covered with a respective microlens.

Referring further to FIG. 6B, the first phase detection pixel pair PDPX_P1b may include the first phase detection pixels PDPX_1b and PDPX_2b. The first photodiode PD1 of the first phase detection pixel PDPX_1b and the second photodiode PD2 of the second phase detection pixel PDPX_2b may be arranged in the substrate 208. Light blocking layers 205_1b and 205_2b may be formed over the substrate 208. A length L of the light blocking layers 205_1b and 205_2b may be variously formed according to the sensitivity of the first phase detection pixel pair PDPX_P1b. In addition, microlenses 202_1b and 202_2b may be respectively individually arranged over the first phase detection pixels PDPX_1b and PDPX_2b of the first phase detection pixel pair PDPX_P1b. A structure of the first phase detection pixel pair PDPX_P1b illustrated in FIG. 6B may also be applied to the second phase detection pixel pair PDPX_P2b. However, the length of the light blocking layers included in the second phase detection pixel pair PDPX_P2b may be less than the length of the light blocking layers 205_1*b* and 205_2*b* included in the first phase detection pixel pair PDPX_P1*b*.

Referring further to FIG. 6C, the first phase detection pixel pair PDPX_P1*b* may further include a color filter 204*b* in a structure illustrated in FIG. 6B. A structure of the first phase detection pixel pair PDPX_P1*b* illustrated in FIG. 6C may also be applied to the second phase detection pixel pair PDPX_P2*b*. However, in this case, the length of the light blocking layers included in the second phase detection pixel pair PDPX_P2*b* may be the same as the length of the light blocking layers 205_1*b* and 205_2*b* included in the first phase detection pixel pair PDPX_P1*b*, but the types and/or the sensitivity of color filters each included in the first phase detection pixel pair PDPX_P1*b* and the second phase detection pixel pair PDPX_P2*b* may be different from each other.

Figure 7C:
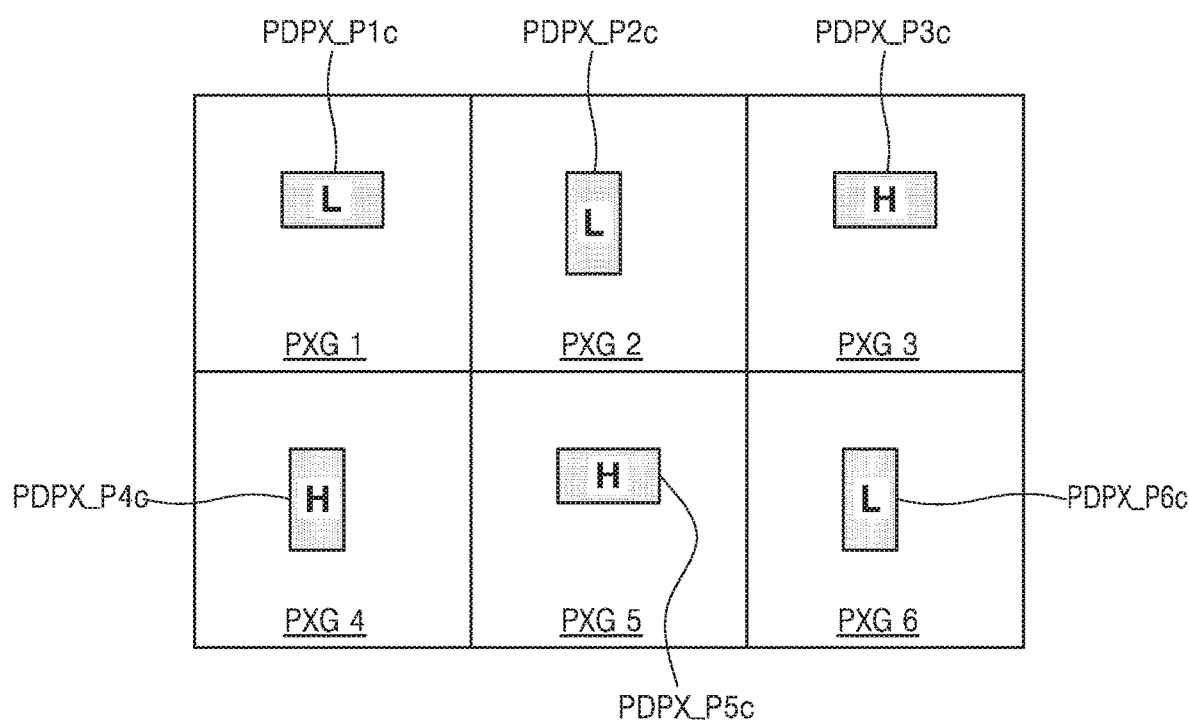

FIGS. 7A through 7C are diagrams illustrating arrangement patterns of phase detection pixel pairs according to some embodiments. Hereinafter, FIGS. 7A through 7C illustrate portions of pixel arrays 210*a*, 210*b*, and 210*c*. "L" refers to lower sensitivity pixel pairs, and "H" refers to higher sensitivity pixel pairs.

Referring to FIG. 7A, the pixel array 210*a* may include first through sixth pixel groups PXG_1 through PXG_6 arranged adjacent to each other. The first through sixth pixel groups PXG_1 through PXG_6 may include first through sixth phase detection pixel pairs PDPX_P1*a* through PDPX_P6*a*, respectively.

In some embodiments, the first phase detection pixel pair PDPX_P1*a*, the third phase detection pixel pair PDPX_P3*a*, and the fifth phase detection pixel pair PDPX_P5*a* may include at least two phase detection pixels arranged adjacent to each other in the horizontal direction. The second phase detection pixel pair PDPX_P2*a*, the fourth phase detection pixel pair PDPX_P4*a*, and the sixth phase detection pixel pair PDPX_P6*a* may include at least two phase detection pixels arranged adjacent to each other in the vertical direction. In addition, the first phase detection pixel pair PDPX_P1*a*, the third phase detection pixel pair PDPX_P3*a*, and the fifth phase detection pixel pair PDPX_P5*a* may have low sensitivity characteristics, and the second phase detection pixel pair PDPX_P2*a*, the fourth phase detection pixel pair PDPX_P4*a*, and the sixth phase detection pixel pair PDPX_P6*a* may have high sensitivity characteristics.

In other words, a phase detection pixel pair of one pixel group may have different arrangement characteristics and different sensitivity characteristics from the phase detection pixel pair of another pixel group arranged adjacent thereto in the vertical direction and/or the horizontal direction.

Referring to FIG. 7B, the pixel array 210*b* may include the first through sixth pixel groups PXG_1 through PXG_6 arranged adjacent to each other. The first through sixth pixel groups PXG_1 through PXG_6 may include first through sixth phase detection pixel pairs PDPX_P1*b* through PDPX_P6*b*, respectively.

In some embodiments, the first phase detection pixel pair PDPX_P1*b*, the second phase detection pixel pair PDPX_P2*b*, and the third phase detection pixel pair PDPX_P3*b* may include at least two phase detection pixels arranged adjacent to each other in the horizontal direction. The fourth phase detection pixel pair PDPX_P4*b*, the fifth phase detection pixel pair PDPX_P5*b*, and the sixth phase detection pixel pair PDPX_P6*b* may include at least two phase detection pixels arranged adjacent to each other in the vertical direction. In addition, the first phase detection pixel pair PDPX_P1*b*, the second phase detection pixel pair PDPX_P2*b*, and the third phase detection pixel pair PDPX_P3*b* may have low sensitivity characteristics, and the fourth phase detection pixel pair PDPX_P4*b*, the fifth phase detection pixel pair PDPX_P5*b*, and the sixth phase detection pixel pair PDPX_P6*b* may have high sensitivity characteristics. However, since embodiments described herein are only examples, the first phase detection pixel pair PDPX_P1*b*, the second phase detection pixel pair PDPX_P2*b*, and the third phase detection pixel pair PDPX_P3*b* may have high sensitivity characteristics, while the fourth phase detection pixel pair PDPX_P4*b*, the fifth phase detection pixel pair PDPX_P5*b*, and the sixth phase detection pixel pair PDPX_P6*b* may have low sensitivity characteristics.

In other words, a phase detection pixel pair of one pixel group may be different from the phase detection pixel pair of another pixel group arranged adjacent to the one pixel group in the vertical direction, and may have the same placement characteristics and the same sensitivity characteristics as the phase detection pixel pair of another pixel group arranged adjacent to the one pixel group in the horizontal direction.

Referring to FIG. 7C, the pixel array 210*c* may include the first through sixth pixel groups PXG_1 through PXG_6 arranged adjacent to each other. The first through sixth pixel groups PXG_1 through PXG_6 may include first through sixth phase detection pixel pairs PDPX_P1*c* through PDPX_P6*c*, respectively.

In some embodiments, the first phase detection pixel pair PDPX_P1*c*, the third phase detection pixel pair PDPX_P3*c*, and the fifth phase detection pixel pair PDPX_P5*c* may each include at least two phase detection pixels arranged adjacent to each other in the horizontal direction. The second phase detection pixel pair PDPX_P2*c*, the fourth phase detection pixel pair PDPX_P4*c*, and the sixth phase detection pixel pair PDPX_P6*c* may each include at least two phase detection pixels arranged adjacent to each other in the vertical direction. In addition, the first phase detection pixel pair PDPX_P1*c*, the second phase detection pixel pair PDPX_P2*c*, and the sixth phase detection pixel pair PDPX_P6*c* may have low sensitivity characteristics, and the third phase detection pixel pair PDPX_P3*c*, the fourth phase detection pixel pair PDPX_P4*c*, and the fifth phase detection pixel pair PDPX_P5*c* may have high sensitivity characteristics. In other words, as in the cases of the first phase detection pixel pair PDPX_P1*c* and the second phase detection pixel pair PDPX_P2*c*, the arrangement characteristics may be different from each other but the sensitivity characteristics may be the same.

In other words, a phase detection pixel pair of one pixel group may have different arrangement characteristics and different sensitivity characteristics from a phase detection pixel pair of another pixel group arranged adjacent to the one pixel group in a vertical direction; among phase detection pixel pairs arranged adjacent to each other in a horizontal direction, a phase detection pixel pair of one pixel group may have different arrangement characteristics from and identical sensitivity characteristics to a phase detection pixel pair of another pixel group arranged on one side of the one pixel group; and among phase detection pixel pairs arranged adjacent to each other in the horizontal direction, a phase detection pixel pair of one pixel group may have different arrangement characteristics and different sensitivity characteristics from a phase detection pixel pair of another pixel group arranged on the other side of the one pixel group.

The embodiments illustrated in FIGS. 7A through 7C are not limited thereto, and phase detection pixel pairs may be arranged in various patterns.

Figure 8:
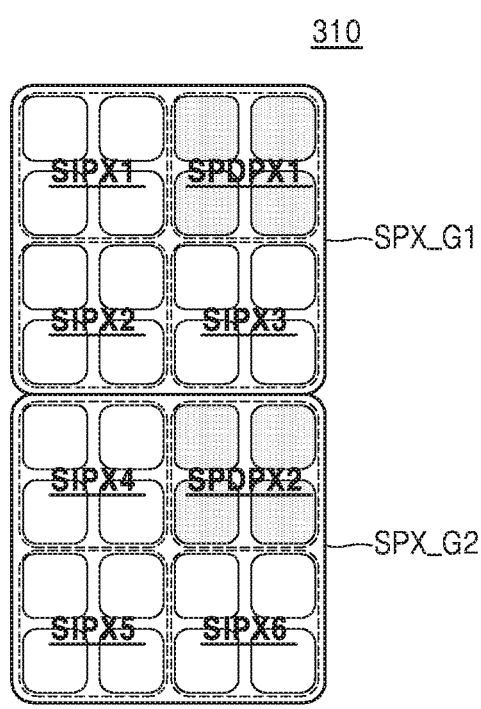
FIG. 8 is a diagram illustrating an example in which some embodiments of the present inventive concepts is applied to a shared pixel structure.

FIG. 8 is a diagram illustrating an example in which some embodiments of the present inventive concepts are applied to a shared pixel structure.

Referring to FIG. 8, a pixel array 310 may include a first shared pixel group SPX_G1 and a second shared pixel group SPX_G2. Hereinafter, it is assumed that a shared pixel group is a unit including a plurality of shared image pixels and one shared phase detection pixel. In addition, a configuration including four subpixels in one shared pixel is described below, but embodiments described herein are not limited thereto, and one shared pixel may include various numbers of subpixels therein. The second shared pixel group SPX_G2 may be arranged adjacent to the first shared pixel group SPX_G1 in the downward direction.

The first shared pixel group SPX_G1 may include first through third shared image pixels SIPX1 through SIPX3 and a first shared phase detection pixel SPDPX1, and the second shared pixel group SPX_G2 may include fourth through sixth shared image pixels SIPX4 through SIPX6 and a second shared phase detection pixel SPDPX2. A shared image pixel may include a plurality of image sensing subpixels, and a shared phase detection pixel may include at least two phase detection subpixels. According to some embodiments, the shared phase detection pixel may include at least one image sensing subpixel. The image sensing subpixel may be a general pixel from which image information is obtained, and the phase detection subpixel may be a pixel capable of obtaining the phase information for phase difference detection AF. Subpixels included in one shared pixel (that is, one shared image pixel or one shared phase detection pixel) may be connected to one selection signal line and receive the same selection signals SELs in FIG. 2. from the row driver 140.

Figure 9A:
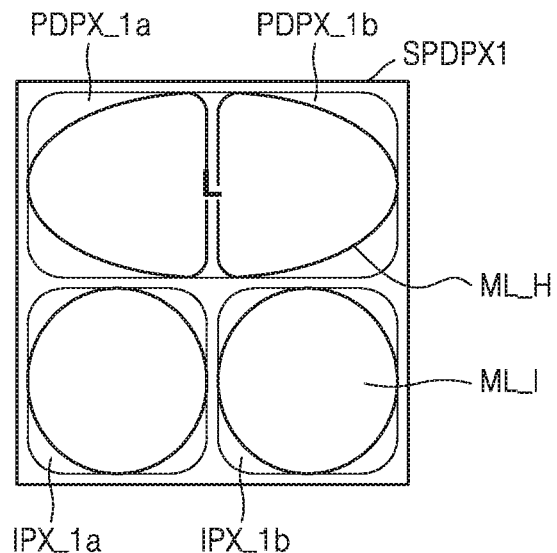
FIGS. 9A and 9B are diagrams illustrating the phase detection shared pixels in FIG. 8 according to some embodiments.
Figure 9B:
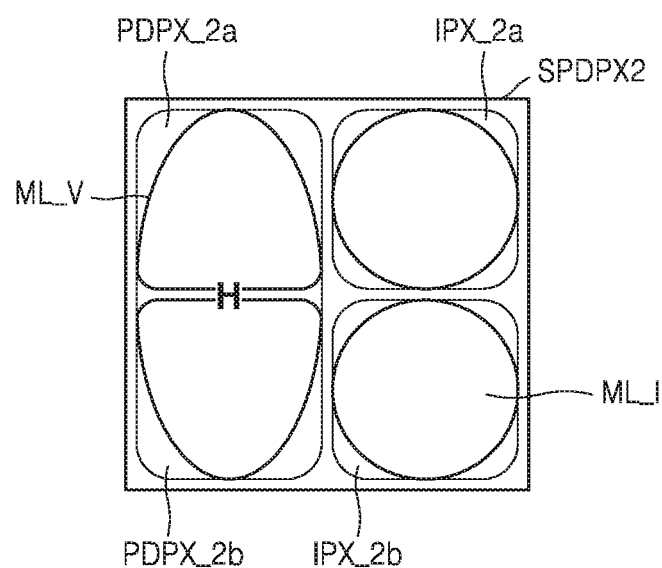

FIGS. 9A and 9B are diagrams illustrating the shared phase detection pixels SPDPX1 and SPDPX2 in FIG. 8, respectively, according to some embodiments.

Referring to FIG. 9A, the first shared phase detection pixel SPDPX1 may include first phase detection subpixels PDPX_1a and PDPX_1b, and first image sensing subpixels IPX_1a and IPX_1b. The first phase detection subpixels PDPX_1a and PDPX_1b may be defined as a first phase detection subpixel pair. The first phase detection subpixels PDPX_1a and PDPX_1b may be arranged adjacent to each other in the horizontal direction and may be covered with one horizontal microlens ML_H. In addition, each of the first image sensing subpixels IPX_1a and IPX_1b may be individually covered with an individual microlens ML_I.

In some embodiments, the types of color filters included in the first phase detection subpixels PDPX_1a and PDPX_1b and the types of color filters included in the first image sensing subpixels IPX_1a and IPX_1b may be identical to or different from each other. A structure of the first phase detection subpixels PDPX_1a and PDPX_1b may be the same as the structure of the first and second phase detection pixels PDPX_1a and PDPX_2a illustrated in FIGS. 4A and 4B, and thus, a detailed description thereof is omitted.

Referring further to FIG. 9B, the second shared phase detection pixel SPDPX2 may include second phase detection subpixels PDPX_2a and PDPX_2b, and second image sensing subpixels IPX_2a and IPX_2b. The second phase detection subpixels PDPX_2a and PDPX_2b may be defined as a second phase detection subpixel pair. The second phase detection subpixels PDPX_2a and PDPX_2b may be arranged adjacent to each other in the vertical direction and may be covered with one vertical microlens ML_H. In addition, each of the second image sensing subpixels IPX_2a and IPX_2b may be individually covered with the individual microlens ML_I.

In some embodiments, the types of color filters included in the second phase detection subpixels PDPX_2a and PDPX_2b and the types of color filters included in the second image sensing subpixels IPX_2a and IPX_2b may be identical to or different from each other. In addition, the sensitivity of the first phase detection subpixels PDPX_1a and PDPX_1b of the first shared phase detection pixel SPDPX1 and the sensitivity of the second phase detection subpixels PDPX_2a and PDPX_2b of the second phase detection shared pixel SPDPX2 may be different from each other, and furthermore, the sensitivity of the first phase detection subpixels PDPX_1a and PDPX_1b may be less than the sensitivity of the second phase detection subpixels PDPX_2a and PDPX_2b. In other words, the type of the color filter included in the first phase detection subpixels PDPX_1a and PDPX_1b may be different from the type of the color filter included in the second phase detection subpixels PDPX_2a and PDPX_2b. A structure of the second phase detection subpixels PDPX_2a and PDPX_2b may be the same as or similar to the structure of the first phase detection pixels PDPX_1a and PDPX_2a described above with reference to FIGS. 4A and 4B, and thus, a detailed description thereof is omitted.

Figure 10A:
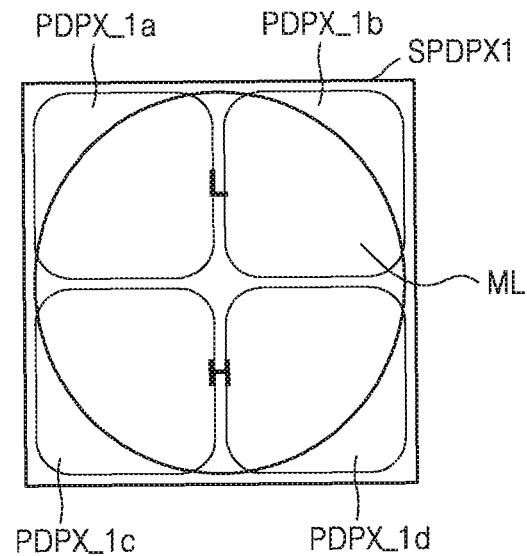
FIGS. 10A and 10B are diagrams illustrating the phase detection shared pixels in FIG. 8 according to further embodiments.
Figure 10B:
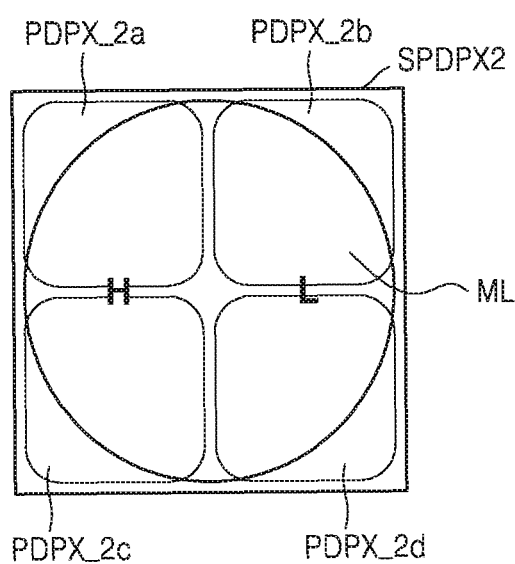

FIGS. 10A and 10B are diagrams illustrating the shared phase detection pixels in FIG. 8 according to further embodiments.

Referring to FIG. 10A, the first shared phase detection pixel SPDPX1 may include four first phase detection subpixels PDPX_1a through PDPX_1d. The first phase detection subpixels PDPX_1a and PDPX_1b may be arranged adjacent to each other in the horizontal direction, and the types of the color filters included therein may be the same. The first phase detection subpixels PDPX_1c and PDPX_1d may be arranged adjacent to each other in the horizontal direction, and the types of the color filters included therein may be the same. In some embodiments, the sensitivity of the first phase detection subpixels PDPX_1a and PDPX_1b may be less than the sensitivity of the first phase detection subpixels PDPX_1c and PDPX_1d. For example, the first phase detection subpixels PDPX_1a and PDPX_1b may include a green color filter, and the first phase detection subpixels PDPX_1c and PDPX_1d may include a white color filter. In addition, the first shared phase detection pixel SPDPX1 may be covered with one microlens ML.

Referring further to FIG. 10B, the second shared phase detection pixel SPDPX2 may include four second phase detection subpixels PDPX_2a through PDPX_2d. The second phase detection subpixels PDPX_2a and PDPX_2c may be arranged adjacent to each other in the vertical direction, and the types of the color filters included therein may be the same. The second phase detection subpixels PDPX_2b and PDPX_2d may be arranged adjacent to each other in the vertical direction, and the types of the color filters included therein may be the same. In some embodiments, the sensitivity of the second phase detection subpixels PDPX_2a and PDPX_2c may be greater than the sensitivity of the second phase detection subpixels PDPX_2b and PDPX_2d. For example, the second phase detection subpixels PDPX_2a and PDPX_2c may include a white color filter, and the second phase detection subpixels PDPX_2b and PDPX_2d may include a green color filter. In addition, the second shared phase detection pixel SPDPX2 may be covered with one microlens ML.

In some embodiments, the sensitivity of the second phase detection subpixels PDPX_2a and PDPX_2c may be the same as the sensitivity of the first phase detection subpixels PDPX_1*c* and PDPX_1*d*, and the sensitivity of the second phase detection subpixels PDPX_2*b* and PDPX_2*d* may be the same as the sensitivity of the first phase detection subpixels PDPX_1*a* and PDPX_1*b*.

Figure 11A:
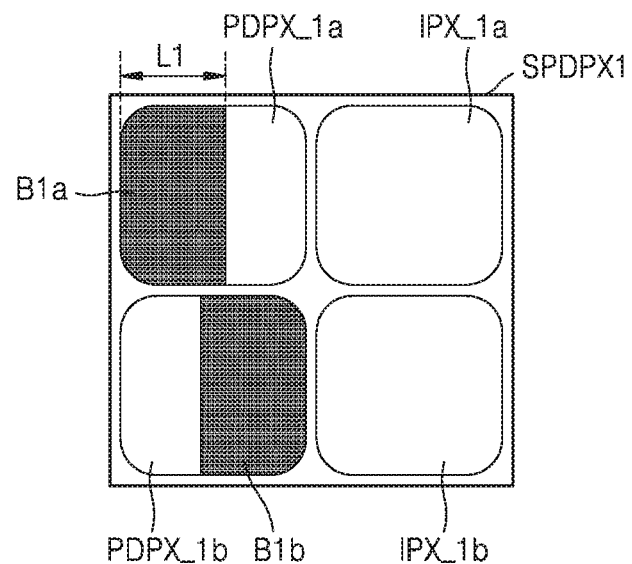
FIGS. 11A and 11B are diagrams illustrating the phase detection shared pixels in FIG. 8 according to yet further embodiments.
Figure 11B:
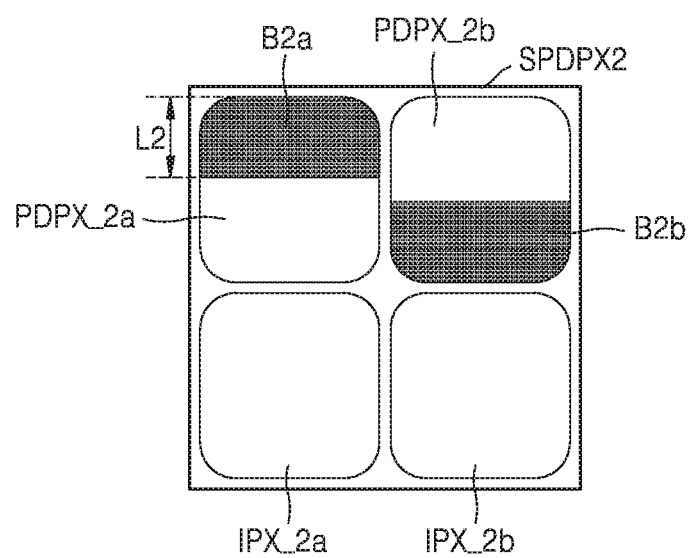

FIGS. 11A and 11B are diagrams illustrating the shared phase detection pixels in FIG. 8 according to further embodiments.

Referring to FIG. 11A, the first shared phase detection pixel SPDPX1 may include first phase detection subpixels PDPX_1*a* and PDPX_1*b*, and first image sensing subpixels IPX_1*a* and IPX_1*b*. The first phase detection subpixels PDPX_1*a* and PDPX_1*b* may be defined as a first phase detection subpixel pair. The first phase detection subpixels PDPX_1*a* and PDPX_1*b* may be arranged adjacent to each other in the vertical direction and may respectively include a light blocking layer B1*a* and a light blocking layer B1*b* each having a first length L1. Although not illustrated in FIG. 11A, the first phase detection subpixels PDPX_1*a* and PDPX_1*b* and the first image sensing subpixels IPX_1*a* and IPX_1*b* may each be individually covered with a respective microlens.

Referring further to FIG. 11B, the second shared phase detection pixel SPDPX2 may include second phase detection subpixels PDPX_2*a* and PDPX_2*b*, and second image sensing subpixels IPX_2*a* and IPX_2*b*. The second phase detection subpixels PDPX_2*a* and PDPX_2*b* may be defined as a second phase detection subpixel pair. The second phase detection subpixels PDPX_2*a* and PDPX_2*b* may be arranged adjacent to each other in the horizontal direction and may respectively include a light blocking layer B2*a* and a light blocking layer B2*b* each having a second length L2.

In some embodiments, the second length L2 of the light blocking layers B2*a* and B2*b* included in the second phase detection subpixels PDPX_2*a* and PDPX_2*b* may be less than the first length L1 of the light blocking layers B1*a* and B1*b* included in the first phase detection subpixels PDPX_1*a* and PDPX_1*b*. As a result, the sensitivity of the second phase detection subpixels PDPX_2*a* and PDPX_2*b* may be greater than the sensitivity of the first phase detection subpixels PDPX_1*a* and PDPX_1*b*. However, embodiments described herein are not limited thereto, and the sensitivity of the second phase detection subpixels PDPX_2*a* and PDPX_2*b* may be implemented to be less than the sensitivity of the first phase detection subpixels PDPX_1*a* and PDPX_1*b*.

Although not illustrated in FIG. 11B, the second phase detection subpixels PDPX_2*a* and PDPX_2*b* and the second image sensing subpixels IPX_2*a* and IPX_2*b* may each be individually covered with a respective microlens.

Figure 12:
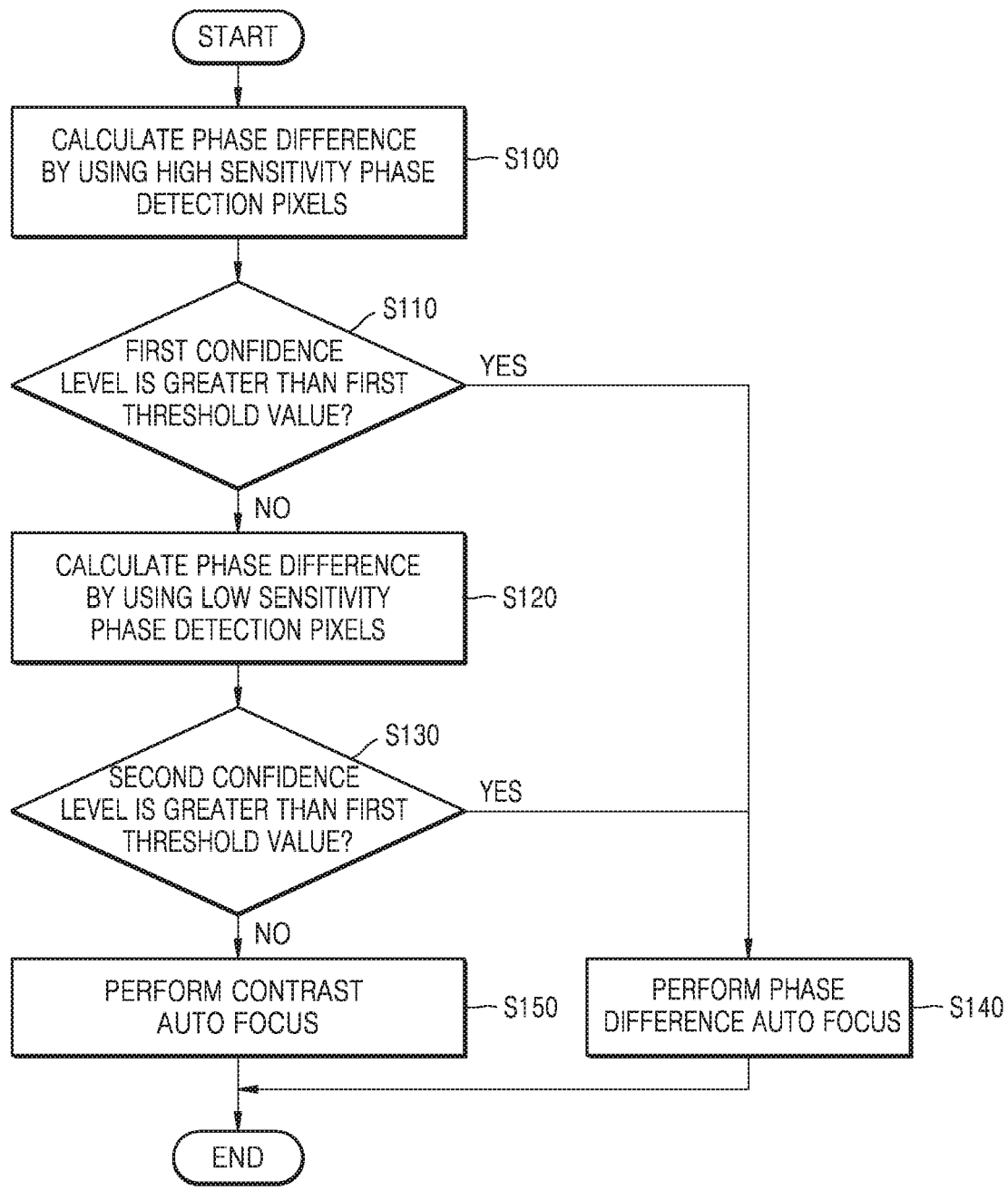
FIGS. 12 and 13 are flowcharts of an auto focus operation of a processor in FIG. 1 according to some embodiments.
Figure 13:
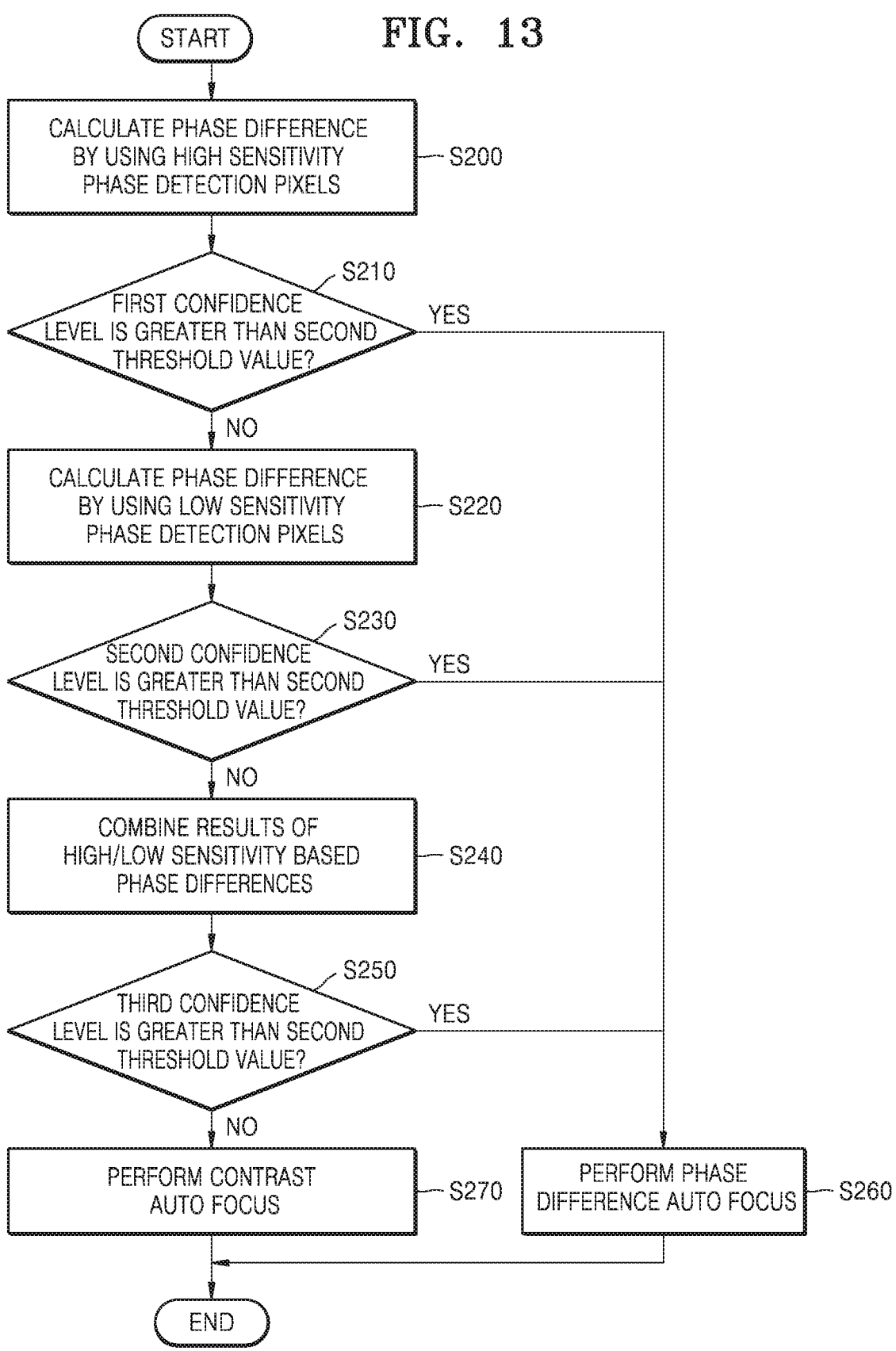

FIGS. 12 and 13 are flowcharts of the AF operation of the processor 1200 in FIG. 1 according to some embodiments.

Referring to FIGS. 1 and 12, the processor 1200 may calculate a first phase difference by using high sensitivity phase detection pixels among the phase detection pixels of the pixel array 110 (S100). The processor 1200 may control the timing controller 120 to receive the phase information of the high sensitivity phase detection pixels among the phase detection pixels of the pixel array 110, and calculate the first phase difference based thereon. In addition, the processor 1200 may generate a first confidence level representing the accuracy of the first phase difference value and may determine whether the first confidence level is greater than the first threshold value (S110). When the first confidence level is greater than the first threshold value (or YES in S110), the processor 1200 may perform a phase difference AF by using the first phase difference value (S140). Otherwise, when the first confidence level is greater than the first threshold value (or NO in S110), the processor 1200 may receive the phase information of the low sensitivity phase detection pixels among the phase detection pixels of the pixel array 110 and may calculate the phase difference based on the received phase information (S120). In addition, the processor 1200 may generate a second confidence level representing the accuracy of the second phase difference value and may determine whether the second confidence level is greater than the first threshold value (S130). When the second confidence level is greater than the first threshold value (or YES in S130), the processor 1200 may perform the phase difference AF by using the second phase difference value (S140). Otherwise, when the second confidence level is not greater than the first threshold value (or NO in S130), the processor 1200 may perform the contrast AF that focuses based on the contrast difference between the images (S150). Although described by way of example with reference to a common threshold value for the first and second confidence levels, it will be understood that respective threshold values for the first and second confidence levels may be used in some embodiments.

Referring to FIGS. 1 and 13, the processor 1200 may calculate the first phase difference by using high sensitivity phase detection pixels among the phase detection pixels of the pixel array 110 (S200). The processor 1200 may control the timing controller 120 to receive the phase information of the high sensitivity phase detection pixels among the phase detection pixels of the pixel array 110, and calculate the first phase difference based thereon. In addition, the processor 1200 may generate a first confidence level representing the accuracy of the first phase difference value and may determine whether the first confidence level is greater than the second threshold value (S210). The second threshold value may be set to be greater than the first threshold value in FIG. 12. When the first confidence level is greater than the second threshold value (or YES in S210), the processor 1200 may perform the phase difference AF by using the second phase difference value (S260). Otherwise, when the first confidence level is less than the second threshold value (or NO in S210), the processor 1200 may receive the phase information of the low sensitivity phase detection pixels among the phase detection pixels of the pixel array 110 and may calculate the second phase difference based on the received phase information (S220). In addition, the processor 1200 may generate a second confidence level representing the accuracy of the second phase difference value and may determine whether the second confidence level is greater than the second threshold value (S230). When the second confidence level is greater than the second threshold value (or YES in S230), the processor 1200 may perform the phase difference AF by using the second phase difference value (S260). Otherwise, when the second confidence level is less than the second threshold value (or NO in S230), the processor 1200 may combine results of the first phase difference and the second phase difference generated by using the high sensitivity/low sensitivity phase detection pixels (S240). In some embodiments, the processor 1200 may provide a first phase difference value with a weight corresponding to the first confidence level, a second phase difference value with a weight corresponding to the second confidence level, and calculate a sum value of the first and second phase difference values. The processor 1200 may generate a third confidence level indicating the accuracy of the calculated sum value and may determine whether the third confidence level is greater than the second threshold value (S250). When the third confidence level is greater than the second threshold value (or YES in S250), the processor 1200 may perform the phase difference AF by using the calculated sum value (S260). Otherwise, when the third confidence level is not greater than the second threshold value (or NO in S250), the processor 1200 may perform the contrast AF (S270).

Figure 14:
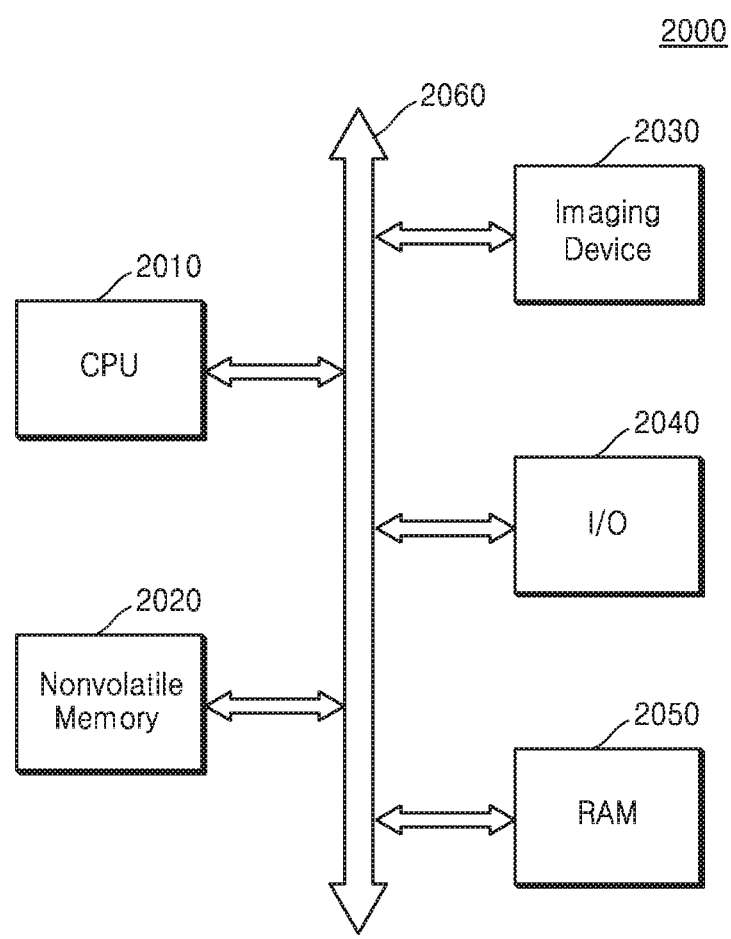
FIG. 14 is a block diagram illustrating a system including an image sensor according to some embodiments.

FIG. 14 is a block diagram illustrating a system 2000 including an image sensor according to some embodiments.

The system 2000 of FIG. 14 may include a computer system, a camera system, a scanner, a vehicle navigation, a video phone, a security system, and/or a motion detection system that require image data. Referring to FIG. 14, the system 2000 may include a central processing unit (CPU) or a processor 2010, a nonvolatile memory 2020, an image pickup device 2030 including an image sensor, an input/output device 2040, and random-access memory (RAM) 2050. The CPU 2010 may communicate via a bus 2060 with the nonvolatile memory 2020, the image pickup device 2030, the input/output device 2040, and the RAM 2050.

The image pickup device 2030 included in the system 2000 of FIG. 14 may include the image sensor described above according to embodiments of the present inventive concepts. For example, the image sensor included in the image pickup device 2030 may include phase detection pixel pairs having different sensitivity characteristics and arrangement characteristics. The image pickup device 2030 may perform the phase difference AF by using the phase detection pixel pairs.

The image data output from the image pickup device 2030 may be transmitted via the bus 2060 to the CPU 2010, the nonvolatile memory 2020, the input/output device 2040, and/or the RAM 2050. The image pickup device 2030 according to some embodiments may provide an improved image through a fast and accurate AF operation.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. The term "and/or" includes any and all combinations of one or more of the associated listed items.

While the inventive concepts has been particularly shown and described with reference to example embodiments thereof, it will be understood by one of ordinary skill in the art that various changes in form and details may be made therein without departing from the spirit and scope of the inventive concepts as defined by the following claims. Accordingly, the true scope of protection of the inventive concepts should be determined by the technical idea of the following claims.

What is claimed is:

1. An image sensor comprising:
   a pixel array comprising a plurality of shared pixels, wherein the plurality of shared pixels comprise:
   a first shared phase detection pixel including first phase detection subpixels arranged adjacent to each other in a first direction, the first phase detection subpixels having a first single microlens thereon, and the first shared phase detection pixel further comprising first image sensing subpixels each having a respective first microlens thereon; and
   a second shared phase detection pixel including second phase detection subpixels arranged adjacent to each other in a second direction different from the first direction, the second phase detection subpixels having a second single microlens thereon, and the second shared phase detection pixel further comprising second image sensing subpixels each having a respective second microlens thereon,
   wherein a first sensitivity of the first phase detection subpixels is different from a second sensitivity of the second phase detection subpixels,
   wherein each of the first phase detection subpixels includes a white color filter or no color filter.

2. The image sensor of claim 1, wherein the first direction and the second direction are orthogonal to each other.

3. The image sensor of claim 1, wherein the second phase detection subpixels do not include a color filter.

4. The image sensor of claim 1, wherein the second shared phase detection pixel is arranged adjacent to the first shared phase detection pixel in the second direction, and the first direction is a horizontal direction and the second direction is a vertical direction.

5. The image sensor of claim 1, further comprising a timing controller configured to differently control a light exposure time for the first phase detection subpixels and a light exposure time for the second phase detection subpixels to generate first and second phase information for calculating a phase difference between respective images.

6. The image sensor of claim 1, wherein the white color filter is a first white color filter,
   wherein each of the second phase detection subpixels includes a second white color filter.

7. The image sensor of claim 1, wherein the plurality of shared pixels further comprise:
   a plurality of shared image sensing pixels, each of the shared image sensing pixels including a plurality of image sensing subpixels each including a respective identical color filter, wherein ones of the image sensing subpixels included in a same shared image sensing pixel are connected to a same selection signal line.

8. The image sensor of claim 1, wherein the second phase detection subpixels included in the second shared phase detection pixel comprise a color filter.

9. The image sensor of claim 1, further comprising:
   a processor configured to perform a computation of a sensitivity-based phase difference by using first phase information received from the first phase detection subpixels and/or second phase information received from the second phase detection subpixels, and to control a lens driver based on a result of the computation.

10. The image sensor of claim 9, wherein the processor is further configured to generate a first phase difference value and a first confidence level of the first phase difference value by using the first phase information, and compute a second phase difference value by using the second phase information based on the first confidence level of the first phase difference value.

11. The image sensor of claim 10, wherein the processor is further configured to control the lens driver by using the first phase difference value when the first confidence level of the first phase difference value is equal to or greater than a threshold value, and generate the second phase difference value and a second confidence level of the second phase difference value when the first confidence level of the first phase difference value is less than the threshold value.

* * * * *